(12) United States Patent
Hussein et al.

(10) Patent No.: US 7,759,968 B1
(45) Date of Patent: Jul. 20, 2010

(54) METHOD OF AND SYSTEM FOR VERIFYING CONFIGURATION DATA

(75) Inventors: Jameel Hussein, Sunnyvale, CA (US);
Dean C. Moss, Raleigh, NC (US);
James A. Walstrum, Jr., San Jose, CA (US)

(73) Assignee: XILINX, Inc., San Jose, CA (US)

( * ) Notice: Subject to any disclaimer, the term of this patent is extended or adjusted under 35 U.S.C. 154(b) by 77 days.

(21) Appl. No.: 11/527,882

(22) Filed: Sep. 27, 2006

(51) Int. Cl.
*H03K 19/173* (2006.01)

(52) U.S. Cl. .............................. 326/38; 326/41; 326/8; 326/9; 716/14; 716/17

(58) Field of Classification Search ............. 326/37–41, 326/47; 716/4–5, 16, 14, 17; 713/180, 189, 713/190, 193; 714/799–802, 807, 811, 815, 714/718, 736, 757, 704
See application file for complete search history.

(56) References Cited

U.S. PATENT DOCUMENTS

| 5,457,408 | A  | * | 10/1995 | Leung ........................ 326/38 |
| 6,363,019 | B1 | * | 3/2002 | Erickson et al. ........ 365/189.07 |
| 6,466,049 | B1 |   | 10/2002 | Diba et al. |
| 6,553,523 | B1 | * | 4/2003 | Lindholm et al. ........... 714/725 |
| 6,772,387 | B1 | * | 8/2004 | Plants ........................ 714/763 |
| 6,996,713 | B1 | * | 2/2006 | Trimberger ................ 713/161 |
| 7,143,329 | B1 | * | 11/2006 | Trimberger et al. ......... 714/746 |
| 7,162,644 | B1 | * | 1/2007 | Trimberger ................. 713/189 |
| 7,190,190 | B1 | * | 3/2007 | Camarota et al. ............. 326/38 |
| 7,200,235 | B1 | * | 4/2007 | Trimberger ................. 380/277 |
| 7,283,409 | B1 | * | 10/2007 | Voogel et al. ............... 365/200 |
| 7,411,417 | B1 | * | 8/2008 | Rutledge et al. ............. 326/38 |
| 7,469,338 | B2 | * | 12/2008 | Buer ........................... 713/170 |
| 2005/0071730 | A1 | * | 3/2005 | Moyer et al. ................ 714/758 |

OTHER PUBLICATIONS

Jameel Hussein; "Multiple-Boot with Platform Flash PROMs"; Application Note: FPGAs; XAPP483 (v1.0); Aug. 7, 2006; available from Xilinx, Inc., 2100 Logic Drive, San Jose, California 95124; pp. 1-7.

* cited by examiner

*Primary Examiner*—James H. Cho
*Assistant Examiner*—Christopher Lo
(74) *Attorney, Agent, or Firm*—John J. King; Kin-Wah Tong

(57) ABSTRACT

A method of verifying configuration data to be loaded into a device having programmable logic is described. The method comprising the steps of validating a configuration bitstream to be loaded into the device having programmable logic; storing a validation indicator with the configuration bitstream in a non-volatile memory device; and configuring the programmable logic according to the configuration bitstream if the validation indicator indicates that valid data is stored in the non-volatile memory device. A system for verifying configuration data to be loaded into a device having programmable logic is also described.

15 Claims, 6 Drawing Sheets

METHOD OF AND SYSTEM FOR VERIFYING CONFIGURATION DATA

FIELD OF THE INVENTION

The present invention relates generally to programmable logic devices, and in particular, to a method of and system for verifying configuration data loaded into a device having programmable logic.

BACKGROUND OF THE INVENTION

A programmable logic device (PLD) is designed to be user-programmable so that users may implement logic designs of their choices. One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. In some CPLDs, configuration data is stored on-chip in non-volatile memory, then downloaded to volatile memory as part of an initial configuration sequence.

Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., flash memory, as in some CPLDs), or in any other type of memory cell.

PLDs also have different "modes" depending on the operations being performed on them. A specific protocol allows a programmable logic device to enter into the appropriate mode. Typical PLDs have internal blocks of configuration memory which specify how each of the programmable cells will emulate the user's logic. During a "program" mode, a configuration bitstream is provided to non-volatile memory, commonly called flash memory. An example of a non-volatile memory is a read-only memory (ROM) (e.g. a programmable ROM (PROM), an erasable PROM (EPROM), or an electrically erasable PROM (EEPROM)) either external to or internal to the programmable logic device. Each address is typically accessed by specifying its row and column addresses. During system power up of a "startup" mode, the configuration bits are successively loaded from the non-volatile memory into static random access memory (SRAM) configuration latches of the configuration logic blocks. At the end of this start-up phase, the PLD is now specialized to the user's design, and the PLD enters into a "user" mode as part of its normal operation.

However, there are several cases in which the data stored in the non-volatile memory required for a given task is misprogrammed, invalid, corrupted or otherwise incorrect. During a write cycle of the non-volatile memory, interrupts may occur that corrupt the programming of a valid bitstream. Retention failures of a non-volatile memory may also cause interim upset of locations over time. Configuration failures are often identified by either a failed cyclic redundancy check (CRC) or a missed preamble. If the bitstream has somehow become corrupted, the CRC failure will likely occur again and again. If there is an absence of the preamble, there will be no synchronization or "sync" word, which normally signifies the beginning of configuration data. Without the sync word, the FPGA will not report a CRC response, leading to a common misconception that the FPGA is defective or that the FPGA may require more configuration clocks to be sent.

Most applications that require read or write access to non-volatile memory assume that the data in the non-volatile memory is valid and do not provide any method of verifying the data before using it. In many cases, the actions to be performed involving the non-volatile memory are critical to the functionality of the main device, such as an FPGA, of a system. For example, during the configuration of an FPGA, data from a separate non-volatile memory is delivered into the FPGA's configuration memory. If the configuration was successful, the FPGA will become operational. However, there is no way of determining, before attempting to configure a conventional device having programmable logic, if the data in the non-volatile memory is valid. The use of invalid data may cause an entire operation of the conventional device to fail. For example, it was simply assumed the data will be valid, and no solution is provided if invalid data is used in the application. While conventional methods accommodate the use of invalid data, such use of a device having invalid data is undesirable. Alternatively, a third device may be used to recover the system in the event of a failed configuration. However, the user of a third device results in an inefficient use of resources.

Accordingly, there is a need for an improved method of and system for verifying configuration data loaded into a device having programmable logic.

SUMMARY OF THE INVENTION

A method of verifying configuration data to be loaded into a device having programmable logic is described. The method comprises validating a configuration bitstream to be loaded into the device having programmable logic; storing a validation indicator with the configuration bitstream in a non-volatile memory device; and configuring the programmable logic according to the configuration bitstream if the validation indicator indicates that the configuration bitstream stored in the non-volatile memory device comprises valid data. The method may further comprise decoding the validation indicator to determine an attribute of the configuration bitstream before configuring the programmable logic according to the configuration bitstream. The method may also comprise monitoring the configuration of the programmable logic using a separate device.

According to an alternate embodiment, a method of verifying configuration data to be loaded into a device having programmable logic comprises storing a plurality of configuration bitstreams; loading a first configuration bitstreams of the plurality of configuration bitstreams; configuring the programmable logic according to the first configuration bitstream; checking a validation indicator of a second configuration bitstream; and reconfiguring the programmable logic according to the second configuration bitstream. Configuring the programmable logic device according to the first configuration bitstream may comprise configuring the programmable logic device according to a configuration bitstream for a diagnostic circuit, while reconfiguring the programmable logic may comprise configuring the programmable logic device according to a user specific configuration.

A system for verifying configuration data to be loaded into a device having programmable logic is also disclosed. The system comprises a non-volatile memory device storing a configuration bitstream having a validation indicator, the validation indicator indicating whether the bitstream comprises valid data; and programmable logic coupled to the non-volatile memory device, the programmable logic implementing a circuit according to the configuration bitstream if the validation indicator indicates that the configuration bitstream comprises valid data. The system may further comprise a second device coupled to the programmable logic, wherein the second device monitors the configuration of the programmable logic.

DETAILED DESCRIPTION OF THE DRAWINGS

Figure 1:
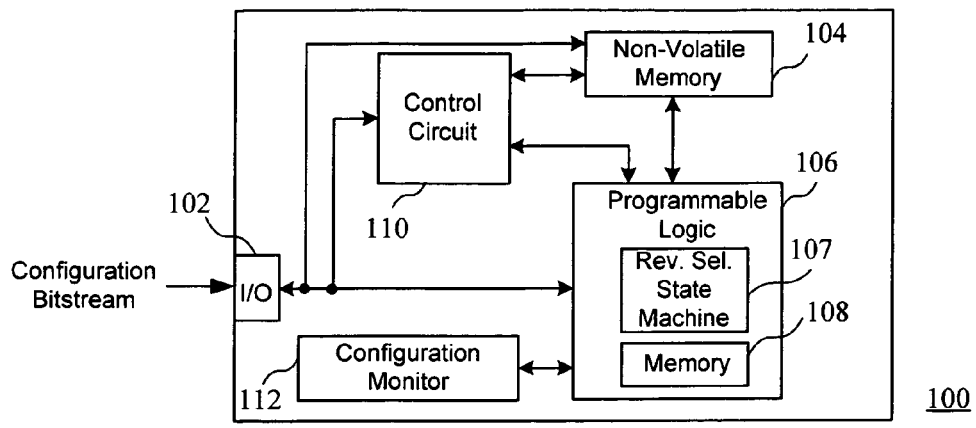
FIG. 1 is a block diagram of a system for verifying configuration data to be loaded into a device having programmable logic according to an embodiment of the present invention.

Turning first to FIG. 1, a block diagram of a system for verifying configuration data to be loaded into a device having programmable logic according to an embodiment the present invention is shown. In particular, a system 100 comprises an input/output (I/O) port 102 which is coupled to receive a configuration bitstream. The configuration bitstream may be directly coupled to a non-volatile memory 104, enabling programming of a programmable logic 106, which comprises a revision select state machine 107 and a memory 108. Alternatively, the bitstream may be coupled directly to the programmable logic 106 or may be coupled to a control circuit 110. While the non-volatile memory 104 may comprise any type of memory, the memory may comprise a serial peripheral interface (SPI) having two data input pins, for example. The operation of the revision select state machine will be described in more detail below in reference to FIGS. 2-5. The system 100 may be an integrated circuit having both a control circuit and a non-volatile memory for programming programmable logic, for example. In particular, the system 100 may be a programmable logic device, or an application specific integrated circuit (ASIC) having programmable logic. Alternatively, the system 100 may be a printed circuit board or other type of circuit board having a plurality of integrated circuits including a control circuit, a non-volatile memory and a programmable logic device. As will be described in more detail below, various aspects of the bitstream and the circuitry enable verifying the configuration data of the bitstream to be loaded into programmable logic.

Figure 2:
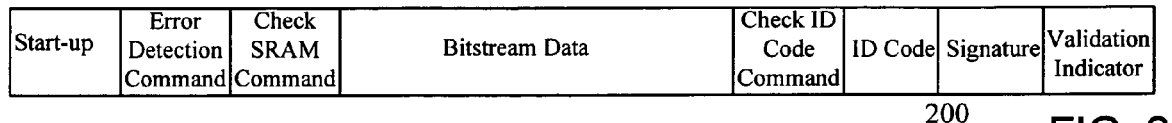
FIG. 2 is a block diagram of a configuration bitstream according to an embodiment of the present invention.

Turning now to FIG. 2, a block diagram of a configuration bitstream according to an embodiment of the present invention is shown. According to one embodiment of the invention, data blocks comprising configuration bitstreams in non-volatile memory are marked in such a way that applications which use the data stored in the non-volatile memory can verify that the data is valid before actually using it. Once the non-volatile memory has been programmed and verified, whether by an FPGA or a microprocessor or some other device or component, an additional byte comprising a validation indicator is programmed in a reserved location to signify that the data has been programmed and verified successfully. The validation indicator, which may be considered "dirty bits," may include additional information related to the bitstream. The validation indicator may be a single bit indicating that the bitstream has been checked and is valid, or a byte having a bit indicating the validity of the data and other information. For example, the validation indicator may contain information about its corresponding data block, the size of the bitstream, or the use of the bitstream (e.g., whether the bitstream is a general or user specific bitstream or a diagnostic bitstream). The validation indicator may be coded and programmed in such a way that an application that intends to use that data may determine specific attributes of the data before the data is actually read from the non-volatile memory, therefore saving time and resources.

By placing the validation indicator first in the bitstream, it is possible for the system to determine whether the bitstream is valid before the entire bitstream is loaded. While the validation indicator is shown as part of the configuration bitstream, the validation indicator need not be part of the bitstream, but could be stored in a flash memory map, or some other location which could be read to determine whether the bitstream has been checked and is determined to be valid. The bitstream may be validated by an external device prior to loading the bitstream into the non-volatile memory, or by the control circuit 110 or programmable logic 106 of the system of FIG. 1. The bitstream in the non-volatile memory could be verified by a bit-by-bit comparison against a known good configuration bitstream, for example. A signature may then be provided to specify a unique text string to identify the configuration data. The signature may comprise a synchronization word to synchronize the configuration logic. An "ID Code" and a "Check ID Code" command indicating that the ID Code should be checked are also provided in the bitstream. The "Check ID Code" signal leads to a comparison of the received ID Code of the bitstream and an ID code for the device which is stored in a memory of the device. An Error Detection Command may be a command for instructing an error detection circuit or error correction circuit, such as a CRC circuit or a multiple input signature register (MISR) circuit, to determine whether an error has occurred in loading the configuration bitstream from the non-volatile memory to the programmable logic. Similarly, a Check SRAM signal requests a check of the bitstream data stored in an SRAM by reading back the data. In particular, the SRAM data read back from the memory is compared to known valid data which should be stored in the SRAM. Finally, the start-up command is provided to enable the startup of the device.

To mark the configuration files, the user preferably changes the first byte in the non-volatile memory file that would be read by the PLD. For example, the first byte may be changed from FF to 00 in a second line of the file using a text editor. In addition, the CRC for that line must also be adjusted. The new CRC is calculated by taking the 2's compliment of the sum of the 8-bit numbers on each line. In the second line, whose line sum is equal to −1, FF is changed to 00 creating an increase in the line sum by 1. Therefore, the CRC must also be adjusted by 1 to offset this new sum.

The methods and circuits, which will be described in more detail below, enable verifying the validity of data in non-volatile memories before it is used in a critical application, such as an application employing a programmable logic device. According to one embodiment, a method to check each data block in the non-volatile memory before the data block is used by the application is described. The system of FIG. 1 will eliminate the use of invalid data from non-volatile memories without the need for an extra logic device. The system will also eliminate the need for recovery time and additional logic by identifying the problem of corrupt or invalid data in the non-volatile memory and enabling the control logic to make the appropriate decision to continue safe operation.

Unlike conventional methods and devices, the methods and systems of the various embodiments of the present invention enable applications to avoid the use of invalid data from any non-volatile memories, regardless of the programming method. The methods and systems allow early indicators of bad non-volatile locations, provide more robust checks of system memory, and in general add confidence in reliability of the programmable logic in a system. A user may also perform random verifications to reset the verification data. Then, when loading configuration data to the programmable logic device, a user may quickly check and verify valid configurations by reading the validation indicator rather than performing a complete verification cycle against a known good configuration bit stream. The various embodiments of the invention are not limited to any specific non-volatile memories, and are not limited to specific programming flows.

Figure 3:
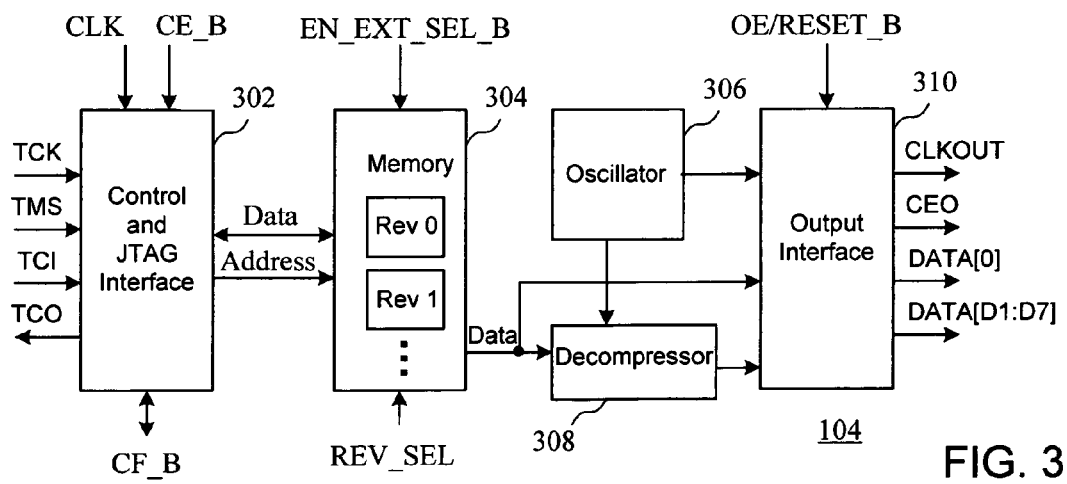
FIG. 3 is a block diagram of a non-volatile memory according to an embodiment of the present invention.

Turning now to FIG. 3, a block diagram of the non-volatile memory 104 according to an embodiment of the present invention is shown. A Joint Test Action Group (JTAG) interface 302 is coupled to control a memory 304. The JTAG test interface preferably comprises test ports complying with the IEEE Standard 1149.1 Test Access Port and Boundary Scan Architecture. In order to program an integrated circuit having programmable logic, designers may use PROM programmers or program by way of the Test Access Port (TAP) of the JTAG ports. The TAP comprises four dedicated pins including a TMS pin for tracking the controller state, a TCK pin for receiving the JTAG test clock, a TDI pin for receiving serial data, and a TDO pin for outputting serial data to support all mandatory JTAG instructions. In addition to receiving a clock (CLK) signal, the JTAG interface also receives an inverted clock enable (CE_B) signal and an inverted configuration control (CF_B) signal, as will be described in more detail below. As will be described in FIG. 7, four I/O pins of the integrated circuit are coupled to the four JTAG pins for easy access to these internal memory areas by an external device.

An inverted enable external select (EN_EXT_SEL_B) signal comprising a signal from another circuit or device, such as the programmable logic 106 or the control circuit 110, is coupled to the memory 304 to enable external revision control of the non-volatile memory 104. A revision selection (REV_SEL) signal is also coupled to the non-volatile memory to enable the selection of one of a plurality of revisions of bitstreams stored in the memory 304 of the non-volatile memory 104. An oscillator 306 is coupled to provide a clock signal to a decompressor 308 and an output interface 310. The output interface receives an inverted reset (OE/RESET_B) signal to allow the memory to output data after a reset. The output interface outputs an output clock (CLK-OUT) signal. As will be described in more detail in reference to FIG. 6, an output status (CEO) acts as a status signal when the internal address counter of the memory has reached the terminal count. Finally, data is output as either serial data (DATA[0]) or parallel data (DATA[D1:D7]). Although an eight bit data output word is shown by way of example, the output data words may be any number of bits, such as sixteen bits, for example.

Figure 4:
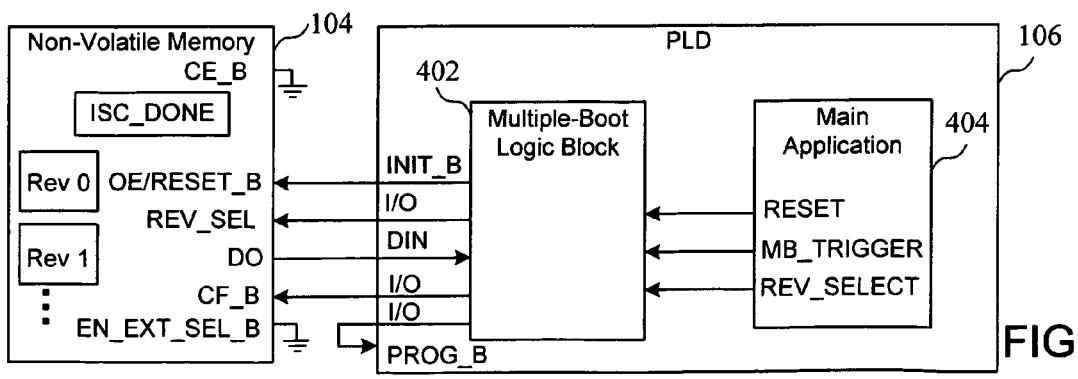
FIG. 4 is a block diagram of a non-volatile memory and a programmable logic device according to an embodiment of the present invention.

Turning now to FIG. 4, a block diagram of a non-volatile memory and a programmable logic device according to an embodiment of the present invention is shown. Some applications implemented in programmable logic devices take advantage of the ability to change the configuration of a PLD at each boot-up, enabling changing the functionality of the PLD as required. Flash PROMs, such as the XCFxx Platform Flash PROMS available from Xilinx, Inc. of San Jose, Calif., offer the advanced ability to store multiple configurations as different revisions in a single PROM. Accordingly, the user can dynamically switch between different revisions stored on the PROM by employing a multiple-boot logic block 402 which enables reprogramming of a main application 404. The main application may comprise programmable logic of the device. For example, the main application may comprise a circuit implemented in a plurality of configuration logic blocks of an FPGA, as will be described in more detail in reference to FIG. 7. An example of an application requiring multiple-boot capabilities is when the PLD needs to support both diagnostic as well as general functionality. In this case, the PLD enables using a diagnostics application to perform board-level tests. If the tests are successful, the PLD then triggers a reconfiguration from a second bitstream or configuration image containing the general functionality needed for normal operation. The general PLD application could be designed to trigger a reconfiguration to reload the diagnostics application at any time as needed.

In the example shown in FIG. 4, the default configuration may be stored in the PROM as Revision 1 and loaded at system reset. When the multiple-boot function is triggered, the PLD automatically reconfigures itself using the bitstream stored as Revision 0 in the non-volatile memory. Design revisioning allows the user to store unique configuration bitstreams on a single non-volatile memory or across multiple cascaded non-volatile memories. When combined with dynamic reconfiguration, the design revision capabilities of the non-volatile memories allow for the creation of multiple-boot applications.

After programming the non-volatile memory with a set of configuration bitstreams, a configuration bitstream stored at a given revision location can be selected using the external REV_SEL pins receiving the REV_SEL signal, or using internal programmable design revision control bits. For example, internal programmable design revision control bits may be stored in the non-volatile memory and set a given register as a default or indicate which revision should be loaded. The EN_EXT_SEL_B pin determines if the external pins or internal programmable design revision bits are used to select the design revision. When the EN_EXT_SEL_B signal is low, design revision selection is controlled by the REV_SEL signal on the external revision select pins. The REV_SEL pins may comprise two pins, for example, to select one of four revisions of a configuration bitstream. When EN_EXT_SEL_B is high, the design revision selection is controlled by the internal programmable revision select control bits.

During power-up, the revision selection inputs are sampled by logic internal to the configuration non-volatile memory. After power-up is complete, when the CE_B signal is asserted (i.e., low), to enable the non-volatile memory inputs, the design revision selection inputs are sampled again after the rising edge of the CF_B pulse. The CE_B pin is preferably tied to ground, and the user will control the CF_B input using an I/O on the PLD. The data from the selected design revision is then presented on the PLD configuration interface. While most of the standard connections to the configuration non-volatile memory remain the same, the CE_B pin is preferably tied low to ensure that the non-volatile memory is always enabled. In contrast, the CE_B pin is connected to a "DONE" signal in conventional devices to disable the non-volatile memory after configuration is complete. However, additional logic may be provided to disable the non-volatile memory when not in use via the CE_B signal in order to save power.

The CF_B pin is driven by an output from the multiple-boot logic block 402 of the PLD instead of the normal connection to a program pin of the PLD. The program (PROG) pin of the PLD is driven by an output from the multiple-boot logic block, requiring the use of one I/O pin of the PLD. The REV_SEL and OE/RESET_B inputs of the non-volatile memory are driven by outputs from the multiple-boot logic block. The multiple-boot logic block monitors the data pin D0 of the non-volatile memory, the RESET pin of the main application to reset the multiple-boot logic block state machine, and a multiple-boot trigger (MB_TRIGGER) signal to determine when to load a new revision.

To enable multiple-boot functionality, an output on the PLD coupled to the CF_B input on the non-volatile memory is used to control the sampling of the revision select pins on the non-volatile memory. When the non-volatile memory sees a rising edge on the CF_B input, it will sample the REV_SEL pins. The REV_SEL pins are driven by other outputs from the PLD to control which revision is used to configure the PLD. After CF_B is driven high, the multiple-boot logic block of the PLD will drive an output connected to PROG_B low to trigger reconfiguration of the main application. After the reconfiguration is complete, the PLD will function with the configuration read from the selected revision. As long as the functionality stored at each revision location is not required simultaneously, the user can take advantage of completely different designs for the same PLD, effectively timesharing the PLD resources.

Figure 5:
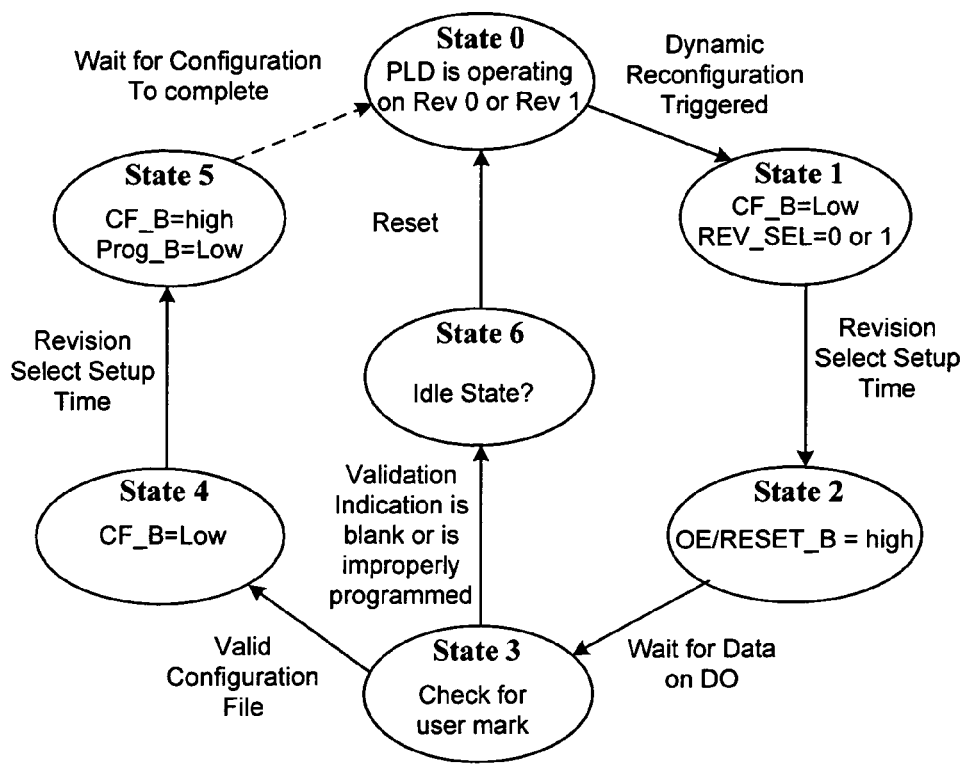
FIG. 5 is a state diagram showing the verification of configuration data according to an embodiment of the present invention.

Turning now to FIG. 5, a state diagram shows the verification of configuration data according to an embodiment of the present invention. The multiple-boot logic block 402 comprises the revision select state machine 107 designed to select the design revisions and enable the dynamic reconfiguration operation. The revision select state machine consists of seven states. The PLD will enter State 0 upon power-up after an initialization state to setup/reset any variables or signals used in the design. The state machine will wait in state 0 for a dynamic reconfiguration trigger from the main application of the PLD to enter State 1.

During a State 1, the multiple-boot logic block drives a low signal to the CF_B pin on the non-volatile memory and passes the revision set by the main application to the REV_SEL pins of the non-volatile memory. The state machine will enter State 2 after the specified set-up time for the REV_SEL signal. During a State 2, the multiple-boot logic block drives a high signal to CF_B and OE/RESET_B on the non-volatile memory. The resulting rising edge on CF_B signals the non-volatile memory to sample the REV_SEL pins. The non-volatile memory is configured such that when the OE/RESET_B signal is driven high, the non-volatile memory will place only the first bit or byte of that revision onto the data bus. Reading only the first byte comprising the validation indicator will avoid unnecessarily downloading configuration data before the configuration bitstream is determined to be valid. After a predetermined period of time, the state machine transitions to State 3.

During State 3, the multiple-boot logic block checks the data on the data bus (D0) for the validation indicator in the non-volatile memory file. In particular, the multiple-boot logic block begins checking the data by setting the revision select pins and sending a rising edge to the CF_B pin on the non-volatile memory. After the set-up time has elapsed, the bits at the validation location are checked by the multiple-boot logic block. If the validation indicator indicates that valid data is present, then the multiple-boot logic block continues to State 4. If the validation indicator does not indicate that the configuration bitstream is valid, then the state machine becomes idle at a State 6. The multiple-boot logic block preferably checks the validation indicator in the configuration file before triggering reconfiguration. According to one embodiment of the invention, the multiple-boot logic block may further wait for the verification of other data in the file. For example, during State 3, data may be clocked out of the non-volatile memory until it is verified that the synchronization word of that bitstream is present.

During a State 4, timing constraints of the system are satisfied, where non-volatile memory is set up again as it was in State 2 to prepare to send configuration data. The machine will enter state 5 after the specified set-up time for the REV_SEL signal. Once in state 5, the state machine drives the CF_B input of the non-volatile memory high and the PROG_B pin on the PLD low. Reconfiguration begins after a predetermined period of time, and the PLD starts erasing the configuration memory. Once the INIT_B signal on the PLD goes high, the PLD is ready for data. The non-volatile memory sends the configuration data stored at the selected revision to PLD. The PLD configuration logic signals that the reconfiguration process is complete by providing a DONE signal. The state machine then returns to State 0. According to an alternate embodiment, each revision contains an instantiation of the multiple-boot logic block. Therefore, after PROG_B goes low in State 5, the configuration memory is erased, including the state machine. That is, the state machine does not actually transition from State 5 back to State 0, but rather ceases operation while in State 5. Finally, the idle state of State 6 is entered into if valid data is not stored at desired revision location. The multiple-boot logic block waits in this state until it receives a RESET signal. Once a RESET signal is received, all signals and variables are reset, and the state machine enters State 0 to await a dynamic reconfiguration trigger such as the MB_TRIGGER signal to attempt a reconfiguration.

The multiple-boot logic block has the added ability to detect a blank or incompletely programmed non-volatile memory. This feature exploits the behavior of certain PROMs to store an in-system configuration done (ISC_DONE) value in a register. In particular, the IEEE Standard 1532 for in-system configuration specifies that the non-volatile memory behave like a blank device until the device program has been successfully written to the satisfaction of an external algorithm. That is, the PROM will not output its programmed data contents until a revision location has been completely programmed. In all other cases of a blank or incompletely programmed revision location, the PROM outputs only ones from its data output pins reflecting a blank state of the revision location. Accordingly, the systems of the present invention take advantage of the ISC_DONE behavior to determine whether a bitstream has been completely programmed into the selected revision location before PLD reconfiguration from that revision location is initiated.

Figure 6:
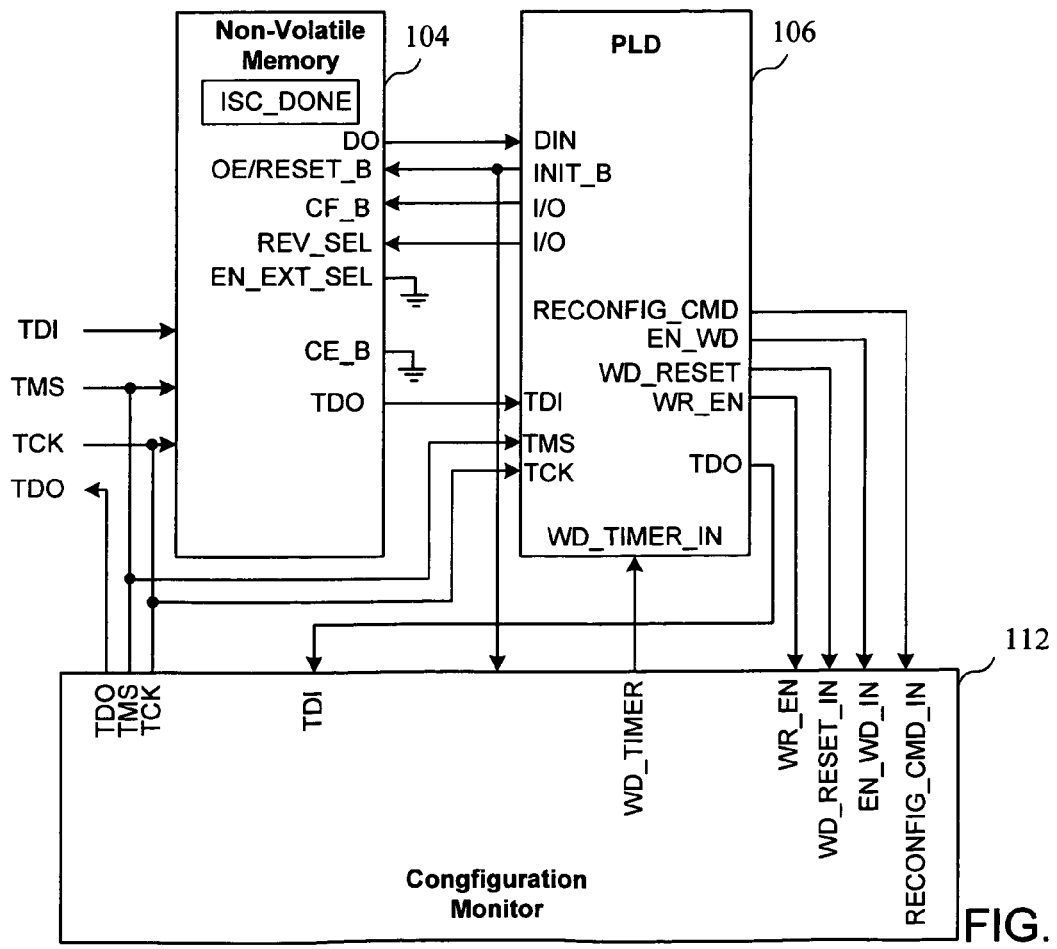
FIG. 6 is a block diagram of a system for verifying configuration data having a configuration monitor according to an embodiment of the present invention.

Turning now to FIG. 6, a block diagram shows a system for verifying configuration data having a configuration monitor according to an embodiment of the present invention. While all of the measures to ensure that data of a configuration bitstream is valid described above greatly reduce the chance of a failed configuration, additional measures may be taken to ensure that valid data is stored in the PLD. For example, the configuration monitor 112 may be added to the non-volatile memory 104 and the programmable logic device 106 of FIG. 4 to implement a fail-safe solution. The configuration monitor 112 is a passive monitor that senses the PLD's configuration status pin (INIT_B) and ensures reliable configuration by sensing common configuration failures. The configuration monitor also monitors a number of other signals from the PLD. In particular, the configuration monitor receives a reconfiguration command (RECONFIG_CMD) from the PLD to initiate a reconfiguration. The configuration monitor also receives a watchdog timer enable (EN_WD) signal to enable the watchdog timer and a watchdog timer reset (WD_RESET) signal to reset the watchdog timer. Finally, a write enable (WR_EN) enables the control of writing to a watchdog timer register. The configuration monitor includes a selectable watchdog timer. The function of the watchdog timer is to ensure proper operation of the target PLD after configuration. The watchdog timer receives a count, "WD_TIMER", representing the count of the watchdog timer which is visible on the output pins of the configuration monitor. If enabled, the watchdog timer will increment to a terminal count. If the target PLD does not reset the timer before the terminal count, the configuration monitor will initiate a reconfiguration from the known-good bitstream. If the user has disabled the watchdog timer of the PLD, a state machine of the configuration monitor traverses back to an idle state. If the watchdog timer is enabled, the configuration monitor state machine stays in a pass state, and monitors the count of the watchdog timer and reset from the PLD. An EN_WD register of the configuration monitor is written to by driving WR_EN low. If the PLD fails to reset the watchdog timer before a predetermined count, the configuration monitor assumes that a failure has occurred and moves to a fail state to initiate a reconfiguration from the known-good bitstream. If a reset signal is sent, and the PLD continues to reset the watchdog timer (WD_TIMER) before its terminal count, the state machine stays in the pass state, and no reconfiguration is initiated. Accordingly, the configuration monitor determines whether the configuration data is correctly loaded into the PLD. It should be understood that the non-volatile memory 104, the programmable logic 106 and the configuration monitor 112 may be implemented on a single integrated circuit or separate integrated circuits. Further, according to one embodiment of the invention, the programmable logic 106 of FIG. 6 may comprise an FPGA, while the configuration monitor 112 may comprise a CPLD, each of which will be described in more detail in reference to FIGS. 7-9.

Figure 7:
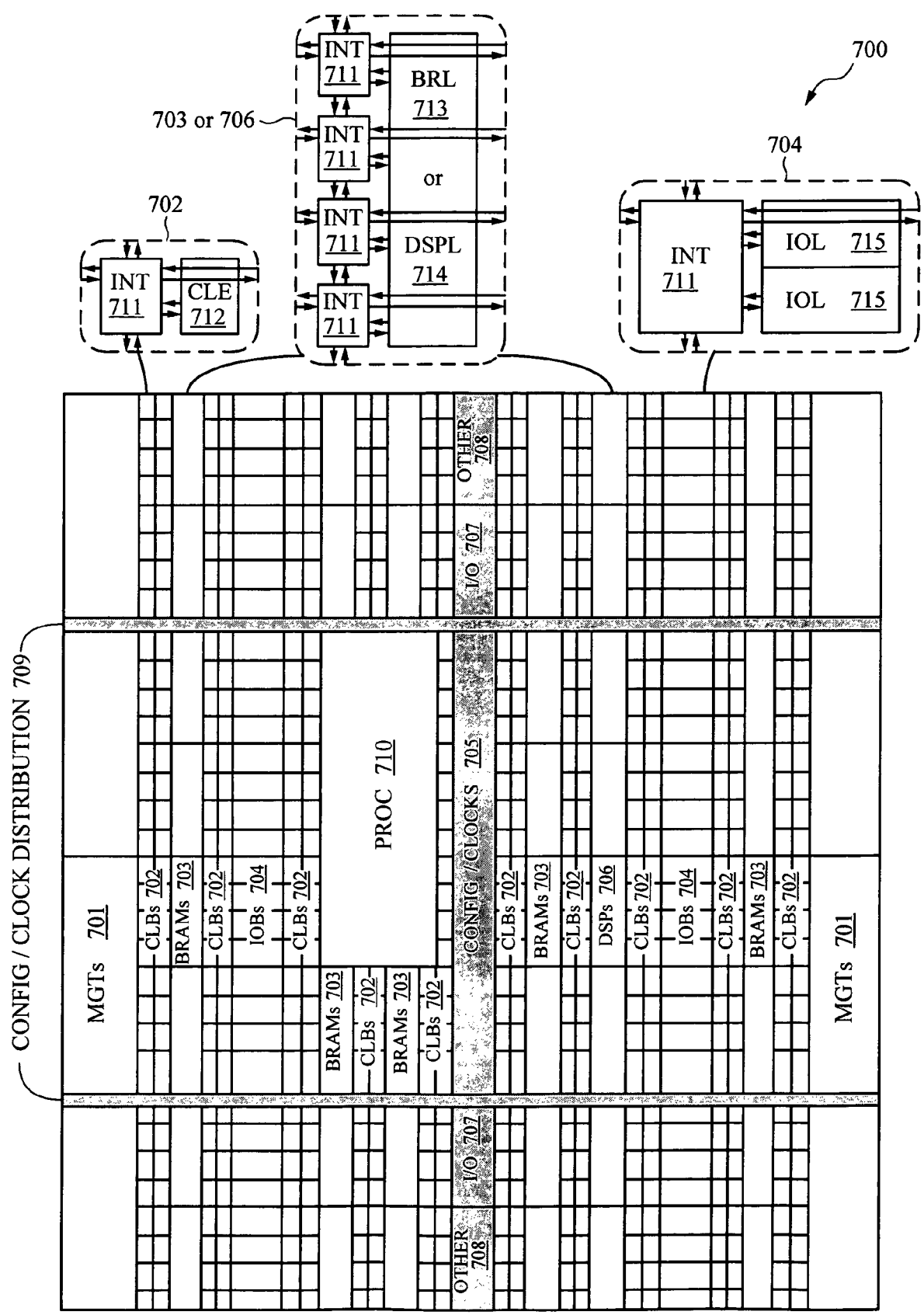
FIG. 7 is a block diagram of a field programmable gate array according to an embodiment of the present invention.

Turning now to FIG. 7, a block diagram of a field programmable gate array according to an embodiment of the present invention is shown. The FPGA architecture 100 of FIG. 7 includes a large number of different programmable tiles including multi-gigabit transceivers (MGTs 701), configurable logic blocks (CLBs 702), random access memory blocks (BRAMs 703), input/output blocks (IOBs 704), con- figuration and clocking logic (CONFIG/CLOCKS 705), digital signal processing blocks (DSPs 706), specialized input/output blocks (I/O 707) (e.g., configuration ports and clock ports), and other programmable logic 708 such as digital clock managers, analog-to-digital converters, system monitoring logic, and so forth. Some FPGAs also include dedicated processor blocks (PROC 710). The programmable logic 106 may be implemented as an FPGA, such as the FPGA of FIG. 7, while the multiple-boot logic block logic block 402 and main application 404 of FIG. 4 may be implemented in configurable logic blocks of the FPGA of FIG. 7. Similarly, the state diagram of FIG. 5 could be implemented as the revision select state machine 107 in the FPGA of FIG. 7.

In some FPGAs, each programmable tile includes a programmable interconnect element (INT 711) having standardized connections to and from a corresponding interconnect element in each adjacent tile. Therefore, the programmable interconnect elements taken together implement the programmable interconnect structure for the illustrated FPGA. The programmable interconnect element (INT 711) also includes the connections to and from the programmable logic element within the same tile, as shown by the examples included at the top of FIG. 7.

For example, a CLB 702 may include a configurable logic element (CLE 712) that may be programmed to implement user logic plus a single programmable interconnect element (INT 711). A BRAM 703 may include a BRAM logic element (BRL 713) in addition to one or more programmable interconnect elements. The BRAM comprises dedicated memory separate from the distributed RAM of a configuration logic block. Typically, the number of interconnect elements included in a tile depends on the height of the tile. In the pictured embodiment, a BRAM tile has the same height as four CLBs, but other numbers (e.g., five) may also be used. A DSP tile 706 may include a DSP logic element (DSPL 714) in addition to an appropriate number of programmable interconnect elements. An 10B 704 may include, for example, two instances of an input/output logic element (IOL 715) in addition to one instance of the programmable interconnect element (INT 711).

In the pictured embodiment, a columnar area near the center of the die (shown shaded in FIG. 7) is used for configuration, clock, and other control logic. Horizontal areas 609 extending from this column are used to distribute the clocks and configuration signals across the breadth of the FPGA. Some FPGAs utilizing the architecture illustrated in FIG. 7 include additional logic blocks that disrupt the regular columnar structure making up a large part of the FPGA. The additional logic blocks may be programmable blocks and/or dedicated logic. For example, the processor block PROC 710 shown in FIG. 7 spans several columns of CLBs and BRAMs.

Note that FIG. 7 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 7 are purely exemplary. For example, in an actual FPGA more than one adjacent column of CLBs is typically included wherever the CLBs appear, to facilitate the efficient implementation of user logic. Similarly the circuits and methods of the present invention may be implemented in any device, including any type of integrated circuit having programmable logic.

Figure 8:
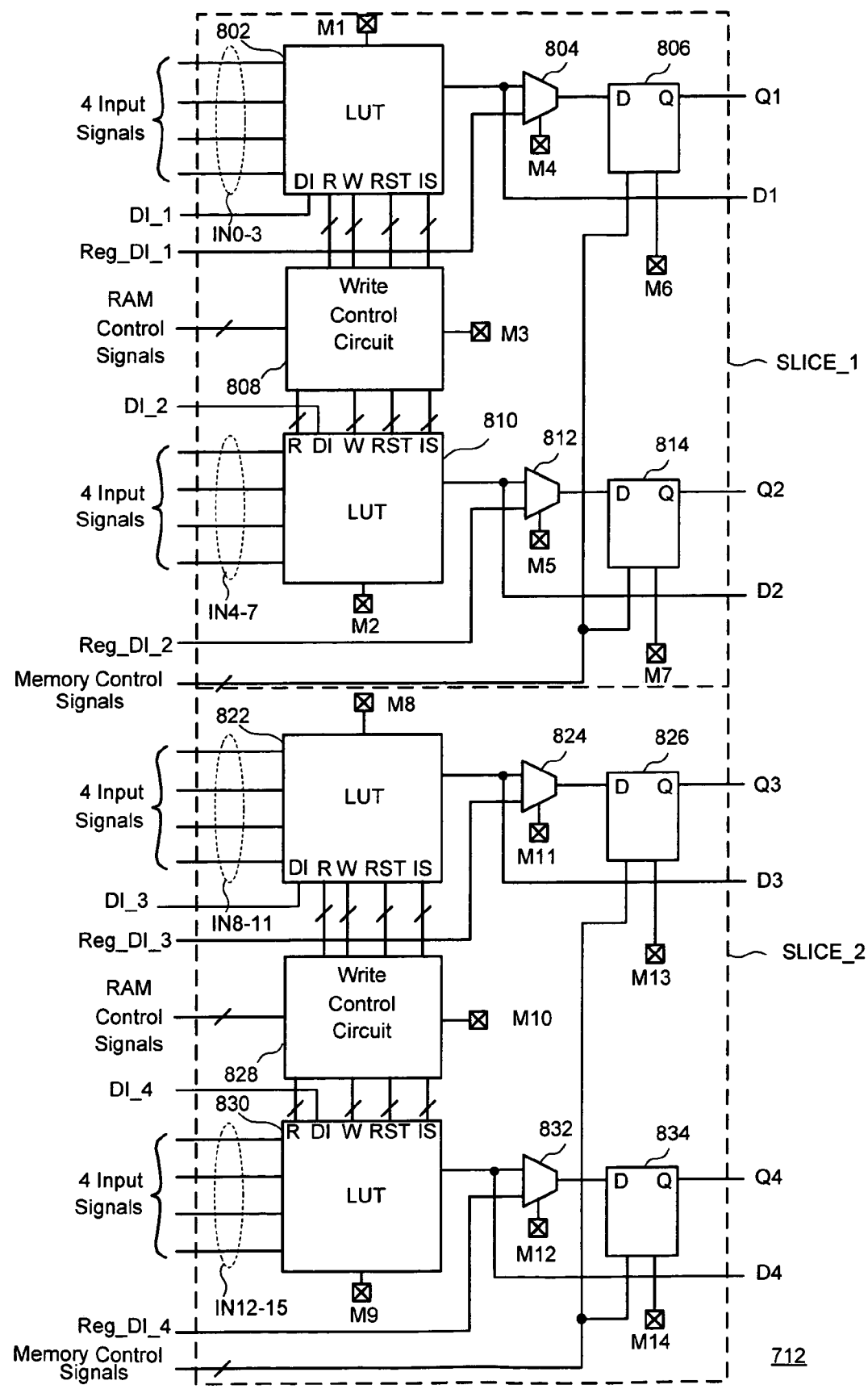
FIG. 8 is a block diagram of a configurable logic element of the field programmable gate array of FIG. 7 according to an embodiment of the present invention.

Turning now to FIG. 8, a block diagram of a configurable logic element of the field programmable gate array of FIG. 7 according to an embodiment of the present invention is shown. In particular, FIG. 8 illustrates in simplified form a configurable logic element of a configuration logic block 702 of FIG. 7. The configurable logic element shown comprises two similar slices, where each slice comprises a pair of function generators. However, the configurable logic element may comprise more slices, such as four slices, for example. Each function generator may function in any of several modes depending upon the configuration data in the configuration memory elements M1-M14. When in RAM mode, input data is supplied by an input terminals DI_1 and DI_2 to the data input (DI) terminal of the associated function generator. Each function generator, which may comprise a lookup table, provides an output signal to an associated multiplexer, which selects between the output signal of the function generator and an associated register direct input signal Reg_DI_1 or Reg_DI_2 from the programmable interconnect element. Thus, each function generator may be optionally bypassed. When in a look-up table mode, each function generator implemented as a look-up table has four data input signals IN0-IN3. Slice 1 comprises a function generator implemented as a LUT 802 coupled to a multiplexer 804. In particular, the LUT 802 receives 4 input signals which are decoded to generate an output D1 associated with data stored in the LUT at the address designated by the input signals. The multiplexer 804 is adapted to receive the output of LUT 802 and a registered value of Reg_DI_1. The output of the multiplexer 804 is coupled to a register 806 which generates an output Q1.

A Write Control Circuit 808 is coupled to receive RAM control signals and generate signals to control the LUT 802. In addition to a data input (DI) coupled to receive DI_1 and conventional read and write control signals coupled to a read enable input (R) and a write enable input (W), respectively, the LUT 802 comprises a partial reset input (RST) for receiving a partial reset signal, and an initial state input (IS) for receiving an initial state signal. Such resetting of the memory elements enables resetting the LUT memory cells during a partial reconfiguration of a programmable logic device, including partial reconfiguration of a device during operation. One advantage of resetting LUT memory elements of a device during partial reconfiguration is that it is not necessary to cycle through the required clock cycles to set the correct data after the partial reconfiguration. Similarly, slice 1 comprises a function generator implemented as a LUT 810 coupled to a multiplexer 812. The LUT 810 is adapted to receive input signals IN4-IN7, while the multiplexer 812 is coupled to receive the output D2 of the LUT 810 and the registered input value Reg_DI_2. The output of the multiplexer 812 is coupled to a register 814 which generates an output Q2. The write control circuit 808 also generates a partial reset signal and an initial state signal for selectively resetting or setting one or more of the bits of the LUT 810.

Similarly, slice 2 comprises a function generator implemented as a LUT 822 coupled to a multiplexer 824. The LUT 822 is adapted to receive input signals IN8-IN11, while the multiplexer 824 is coupled to receive the output of the LUT 822 and a registered input value Reg_DI_3. The output of the multiplexer 824 is coupled to a register 826 which generates an output Q3. A Write Control Circuit 828 is coupled to receive RAM control signals and generate signals to control the LUT 822. In particular, input signals IN8-IN11 are decoded to generate an output D3 associated with data stored in the LUT at the address designated by the input signals. The LUT 822 comprises a partial reset input (RST) for receiving a partial reset signal, and an initial state input (IS) for receiving an initial state signal. Similarly, slice 2 comprises a function generator implemented as a LUT 830 coupled to a multiplexer 832. The LUT 830 is adapted to receive input signals IN12-IN15, while the multiplexer 832 is coupled to receive the output D4 of the LUT 830 and a registered input value Reg_DI_4. The output of the multiplexer 832 is coupled to a register 834 which generates an output Q4. The write control circuit 828 also generates a partial reset signal and an initial state signal for selectively resetting or setting one or more of the bits of the LUT 830.

Figure 9:
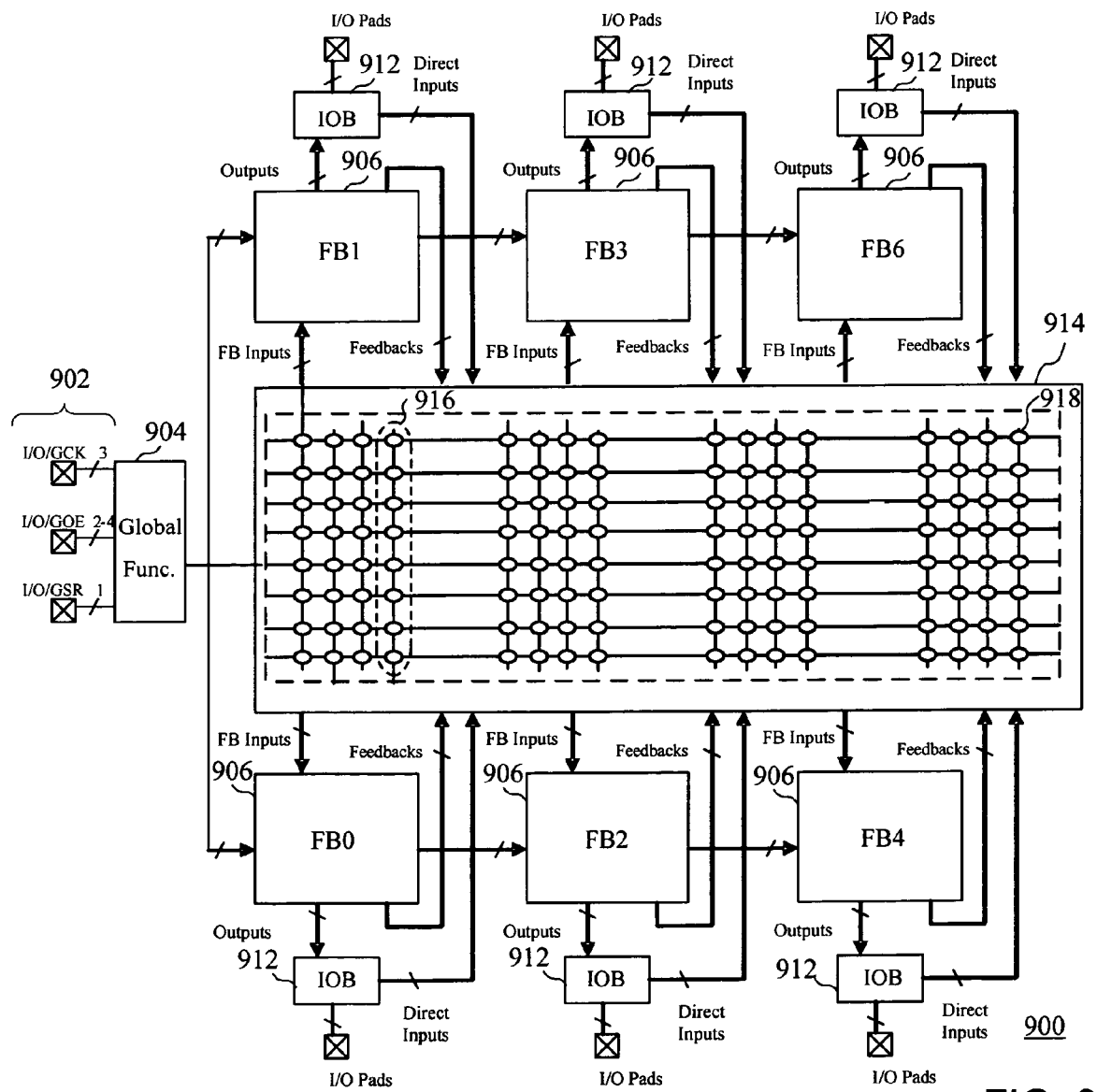
FIG. 9 is a block diagram of a complex programmable logic device according to an embodiment of the present invention.

Turning now to FIG. 9, a block diagram of a CPLD according to an embodiment of the present invention is shown. The CPLD comprises a plurality of input/output pads 902 coupled to a global functions block 904, which may provide clock signals to the remaining portions of the CPLD and enable routing of data to and from the internal circuits of the CPLD. The CPLD further comprises a plurality of function blocks 906 (FB1 through FB6), which comprise blocks of programmable logic. Each function block of the CPLD typically includes a two-level AND/OR structure similar to those used in Programmable Logic Arrays (PLAs) and Programmable Array Logic (PAL) devices, as is well known in the art.

The function blocks are connected together and to input/output blocks 912 by a programmable interconnection array 914. The programmable interconnection array includes many multiplexer circuits 916, each including several PIPs 918. In each multiplexer circuit 916, only one PIP 918 is enabled. The enabled PIP selects one of the many input signals provided to the interconnection array, and the selected input signal is provided as the output signal from the multiplexer circuit 916. Further information on CPLDs may be found, for example, in U.S. Pat. No. 6,466,049 B1 by Sholeh Diba et al., issued Oct. 15, 2002, which is hereby incorporated herein by reference.

Figure 10:
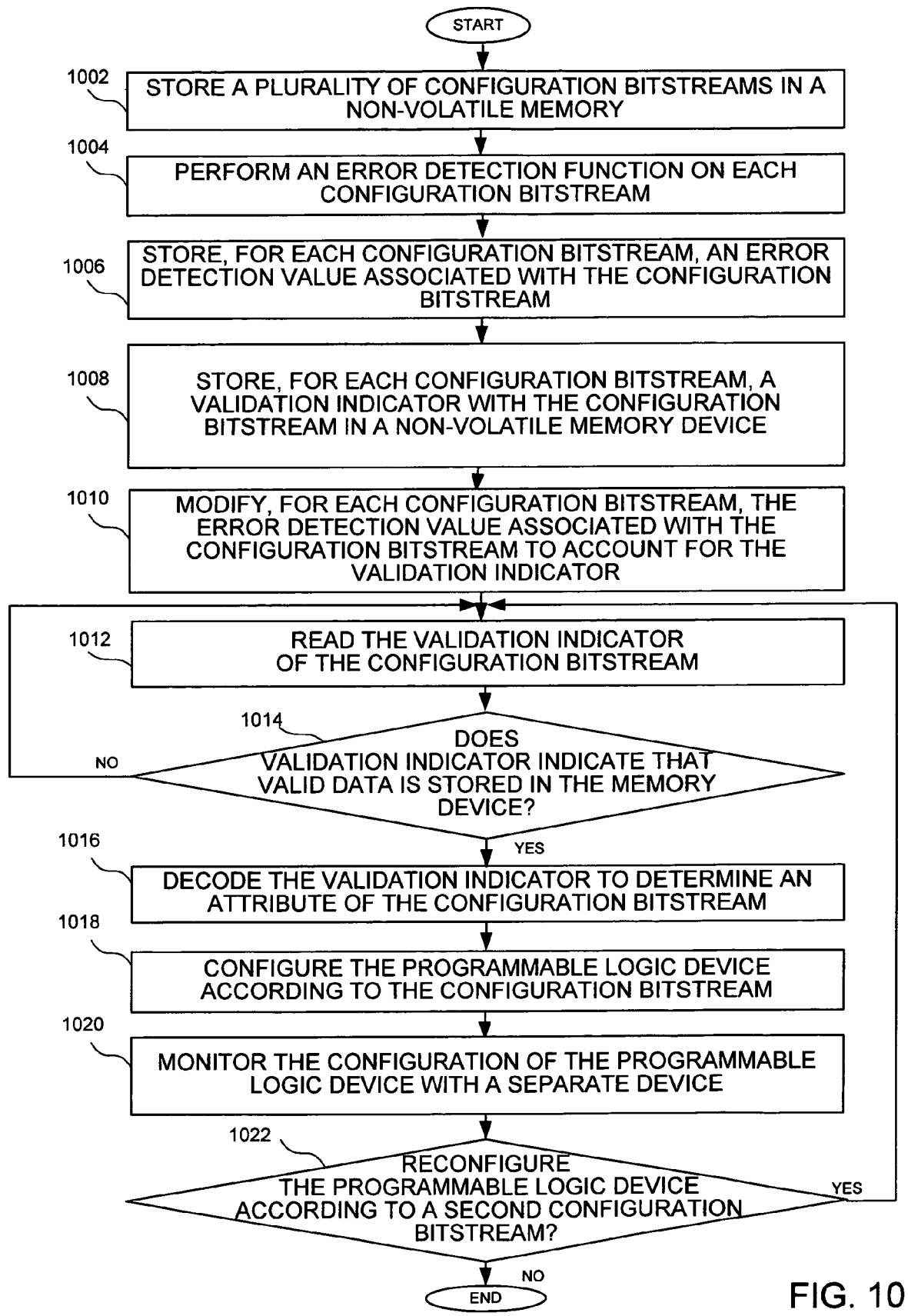
FIG. 10 is a flow chart showing a method of verifying configuration data to be loaded into a programmable logic device according to an embodiment the present invention.

Turning now to FIG. 10, a flow chart shows a method of verifying configuration data to be loaded into a device having programmable logic according to an embodiment the present invention. The method of FIG. 10 could be implemented using any of the circuits of FIGS. 1-9 as described, or any other suitable circuit. A plurality of configuration bitstreams is stored in a non-volatile memory at a step 1002. An error detection function is performed on each configuration bitstream at a step 1004. An error detection value associated with the configuration bitstream is stored, for each configuration bitstream, at a step 1006. A validation indicator is stored with the configuration bitstream in a non-volatile memory device for each configuration bitstream at a step 1008. The error detection value associated with the configuration bitstream is modified, for each configuration bitstream, to account for the validation indicator at a step 1010. The validation indicator of the configuration bitstream is read at a step 1012. It is then determined whether the validation indicator indicates that valid data is stored in the non-volatile memory device at a step 1014. The validation indicator is decoded to determine an attribute of the configuration bitstream at a step 1016. The programmable logic device is configured according to the configuration bitstream at a step 1018. The configuration of the device having configurable logic is separately monitored at a step 1020. It is then determined if a second configuration bitstream should be loaded at a step 1022. If so, the second configuration bitstream is loaded at the step 1012.

It can therefore be appreciated that the new and novel method of and system for verifying configuration data has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A method of verifying configuration data to be loaded into a device having programmable resources, the method comprising:
storing a configuration bitstream in a non-volatile memory device;
validating the configuration bitstream to be loaded into the device having programmable resources by analyzing data of the configuration bitstream;
storing a validation indicator with the configuration bitstream in the non-volatile memory device,
the validation indicator signifying whether the data in the configuration bitstream stored in the non-volatile memory device has been verified to correspond to known good data during the analyzing of the data of the configuration bitstream;
modifying an error detection value associated with the configuration bitstream to account for the validation indicator in the configuration bitstream;
performing an error detection function on the configuration bitstream; and
configuring the programmable resources according to the configuration bitstream stored in the non-volatile memory device if the validation indicator indicates that the data of the configuration bitstream stored in the non-volatile memory device corresponds to the known good data.

2. The method of claim 1, wherein said storing said validation indicator comprises storing a byte of data having information related to the configuration bitstream.

3. The method of claim 2, further comprising decoding the validation indicator to determine an attribute of the configuration bitstream before configuring the programmable resources according to the configuration bitstream.

4. The method of claim 1, further comprising monitoring the configuring of the programmable resources using a separate device.

5. The method of claim 1, further comprising reconfiguring the programmable resources according to a second configuration bitstream.

6. A method of verifying configuration data to be loaded into a device having programmable resources, the method comprising:
storing a plurality of configuration bitstreams in a non-volatile memory device;
validating the plurality of configuration bitstreams by analyzing data of the plurality of configuration bitstreams;
storing, for each configuration bitstream of the plurality of configuration bitstreams, a validation indicator signifying whether data of the configuration bitstream corresponds to known good data during the analyzing of the data of the plurality of configuration bitstreams,
loading a first configuration bitstream of the plurality of configuration bitstreams;
configuring the programmable resources according to the first configuration bitstream;
checking a validation indicator of a second configuration bitstream of the plurality of configuration bitstreams, the validation indicator signifying whether data in the second configuration bitstream stored in the non-volatile memory device has been verified to correspond to known good data during the analyzing of the data of the plurality of configuration bitstreams; and
reconfiguring the programmable resources according to the second configuration bitstream;
wherein configuring the programmable resources according to the first configuration bitstream comprises configuring the programmable resources according to a diagnostic configuration.

7. The method of claim 6, further comprising checking the validation indicator of the first configuration bitstream before loading the first configuration bitstream into the programmable resources.

8. The method of claim 6, further comprising modifying an error detection value associated with the second configuration bitstream to account for the validation indicator in the second configuration bitstream.

9. The method of claim 6, wherein reconfiguring the programmable resources according to the second configuration bitstream comprises reconfiguring the programmable resources according to a user specific configuration.

10. A system for verifying configuration data to be loaded into a device having programmable resources, the system comprising:
a non-volatile memory device storing a configuration bitstream having a validation indicator added to the configuration bitstream after the configuration bitstream is initially stored in the non-volatile memory device, the validation indicator signifying whether data in the configuration bitstream stored in the non-volatile memory device has been verified to correspond to known good data; and
programmable resources coupled to the non-volatile memory device, the programmable resources implementing a circuit according to the configuration bitstream if the validation indicator indicates that the configuration bitstream comprises data which corresponds to the known good data.

11. The system of claim 10, wherein the non-volatile memory stores a plurality of configuration bitstreams, each configuration bitstream having a validation indicator indicating whether the configuration bitstream corresponds to the known good data.

12. The system of claim 10, wherein the validation indicator comprises a byte of the configuration bitstream having information related to the configuration bitstream.

13. The system of claim 10, further comprising a second device coupled to the programmable resources, the second device monitoring a configuration of the programmable resources.

14. The system of claim 13, wherein the programmable resources comprise a field programmable gate array.

15. The system of claim 14, wherein the second device comprises a complex programmable logic device.

* * * * *